United States Patent
Bispo et al.

(10) Patent No.: US 8,405,217 B2
(45) Date of Patent: Mar. 26, 2013

(54) COATING METHOD AND SOLUTIONS FOR ENHANCED ELECTROMIGRATION RESISTANCE

(75) Inventors: Isabelle Bispo, Saulx les Chartreux (FR); Nathalie Thieriet, Paris (FR); Paolo Mangiagalli, Fontanil Cornillon (FR)

(73) Assignee: Alchimer, Massy (FR)

(*) Notice: Subject to any disclaimer, the term of this patent is extended or adjusted under 35 U.S.C. 154(b) by 829 days.

(21) Appl. No.: 11/714,435

(22) Filed: Mar. 5, 2007

(65) Prior Publication Data

US 2007/0262449 A1    Nov. 15, 2007

Related U.S. Application Data

(60) Provisional application No. 60/778,923, filed on Mar. 6, 2006.

(51) Int. Cl.
*H01L 23/532* (2006.01)

(52) U.S. Cl. .................... 257/758; 257/753

(58) Field of Classification Search .................. 257/753, 257/E21.584, 758; 438/628, 644, 654
See application file for complete search history.

(56) References Cited

FOREIGN PATENT DOCUMENTS

FR    2 868 085     9/2005

OTHER PUBLICATIONS

Kariuki et al., Formation of Multilayers on Glassy Carbon Electrodes via the Reduction of Diazonium Salts, Langmuir 2001, 17, 5947-5951.*

International Search Report for International Publication No. PCT/EP2007/052091 dated May 30, 2007.
Hu et al., "Electromigration of Cu/low dielectric constant interconnects", Microelectronics Reliability. vol. 46, Issues 2-4. pp. 213-231.
Wolf, "Dual-Damascene Interconnects" Silicon processing for the VLSI Era. vol. 4, pp. 671-687.
Wang et al., "Comparison of characteristics and integration of copper diffusion-barrier dielelectrics" Thin Solid Films. 498 (2006) pp. 36-42.

* cited by examiner

*Primary Examiner* — Richard Elms
*Assistant Examiner* — Harry W Byrne
(74) *Attorney, Agent, or Firm* — Hamre, Schumann, Mueller & Larson, P.C.

(57) ABSTRACT

The present invention concerns a methods and compositions for preparing a multi layer composite device, such as a semiconductor device.
Said method comprises
(A) forming a dielectric layer on the surface of a composite material by bringing said surface into contact: a) either with a solution, comprising the diazonium salt of aniline, a diazonium salt bearing at least one functional group or an amine compound of formula $H_2N-A-X-Z$ as defined in claim 1: b) or with
    a first solution containing an aryl diazonium salt and successively
    a second solution containing a compound bearing at least one functional group and bearing at least one functional group capable of reacting with the aryl radical grafted on the surface of the composite material thanks to the aryl diazonium salt;
(B) forming an overlayer on said surface of said composite material obtained in step (A), said overlayer consisting of a Si-containing dielectric Cu-Etch Stop Layer and/or copper diffusion barrier.

16 Claims, No Drawings

COATING METHOD AND SOLUTIONS FOR ENHANCED ELECTROMIGRATION RESISTANCE

The present invention generally concerns a method and compositions for improving adhesion strength between copper and etch-stop layer (ESL) and therefore limiting surface diffusion of copper, in particular electromigration i.e. under electric field, during operations of semiconductor devices.

BACKGROUND OF THE INVENTION

Copper has become widely adopted to form multilevel interconnects required in today's ultra large scale integration (ULSI) semiconductor devices, due to its lower resistivity compared to aluminum and its improved electromigration resistance.

Multilevel interconnects consist in a network of copper lines (formed into trenches) that are used to distribute various signals as well as power and ground to different areas of an integrated circuit. In order to improve real estate-efficiency, these lines are stacked in several levels separated by a dielectric material and these levels are connected to each other through vertical apertures called vias.

Lines and vias are usually formed using the damascene process sequence (See for example S. Wolf: "Silicon processing for the VLSI Era", Vol. 4, p. 671-687) in which, at each level of the interconnect system, features are etched in the dielectric material and subsequently filled with copper before being planarized. A simplified version of this sequence can be described as follows:
- dry etching of the dielectric material to form trenches and/or vias;
- deposition (conventionally by physical vapor deposition—PVD) of a Cu diffusion barrier (usually TaN/Ta) since copper is a fast diffuser through dielectrics and can reach the underlying transistors built into the silicon, causing device failures;
- deposition of a "seed layer" of copper, conventionally by PVD;
- electrochemical deposition of copper to fill the vias and trenches;
- planarization by chemical-mechanical polishing (CMP) to leave inlaid copper lines; that is, the surface of copper at the same level as the surface of the surrounding dielectric;
- deposition over the inlaid copper lines of a dielectric encapsulation layer (generally SiCN, SiN, SiC, SiOCN or SiON deposited by plasma-enhanced chemical vapor deposition—PECVD) which serves as a copper diffusion barrier as well as an etch-stop layer (ESL) during patterning and etching of the overlying inter-metal dielectric material;
- deposition of the next level of inter-metal dielectric material (generally a material having a low dielectric permittivity, below 4.0).

As device integration density increases, the width of lines, vias and other features on the circuits decreases. As a result, the cross-section of lines and vias decreases and current densities carried through copper lines increase.

The increase in current density enhances the electromigration phenomenon in copper interconnects. Electromigration can be described by the displacement of metal atoms in interconnect lines in the direction of the current flow.

As a result of the motion of copper atoms, vacancies and then voids are formed in certain areas of copper lines, causing reliability issues and, with time, complete failures of the interconnect system and subsequently of the integrated circuit itself.

It has been shown (See for example C. K. Hu et al., Microelectronics and Reliability, Vol. 46, Issues 2-4, p. 213-231) that in copper lines, electromigration primarily proceeds through surface diffusion of copper atoms or ions as the surface diffusion coefficient of copper is higher than its self-diffusion coefficient. Surface diffusion of copper occurs preferentially along the weakest interface of a copper line where loosely bound copper atoms have more mobility.

In copper lines, the weakest interface is the top surface of the line in contact with the ESL (See for example T. C. Wang et al., Thin Solid Films, 498 (2006) p. 36-42).

It is therefore desirable to enhance the adhesion strength between copper and the ESL in order to limit surface diffusion of copper, improve electromigration resistance and reliability of the interconnect system.

Several techniques have been proposed to achieve better adhesion of ESL to copper and better electromigration resistance.

Plasma treatments in reducing atmosphere such as ammonia or hydrogen have been employed (see for example U.S. Pat. Nos. 6,946,401, 6,764,952 and 6,593,660) to reduce copper oxides and eliminate other contaminants present on the copper surface, thus resulting in better adhesion of the ESL. However, the physical and directional nature of the treatment induces some copper sputtering over the surrounding dielectric areas resulting in a risk of higher line-to-line leakage. Some of the top surface copper is removed during the process, resulting in increased line resistance which decreases the interconnect performance.

Silicidation of the copper surface has been proposed to enhance adhesion with Si-based ESL (see for example U.S. Pat. Nos. 6,492,266, 6,977,218 and 5,447,887). During the silicidation process, some copper from the line is consumed to form the more resistive copper silicide. This results in increased line resistance also.

Doping copper with other metals such as Ag or Zr, either in the bulk of the line during the electrochemical filling step, or in a localized manner on the top surface of copper lines has also been suggested to enhance resistance to electromigration (see for example U.S. Pat. Nos. 6,387,806 and 6,268,291). In this case, the dopants will act either as physical copper diffusion blockers or will assist in creating larger copper grains to eliminate copper diffusion pathways.

Once again, the use of dopants which have lower electrical conductivity compared to copper will increase line resistance.

The use of selective and conductive capping layers over copper lines such as CoWP layers deposited by an electroless deposition process has also been proposed (see for example U.S. Pat. Nos. 6,893,959 and 6,902,605 and US application No. 2005/0266673). In this case, copper surface diffusion is limited by metal-to-metal bonding. Such capping layers may also possess copper diffusion barrier properties, thus theoretically eliminating the need for a SiCN layer.

However, their integration in the dual damascene process sequence without the use of ESLs is not straightforward; in particular when via misalignments have to be taken into account.

Furthermore, deposition selectivity is very difficult to maintain when line density increases. This causes increased line-to-line leakage and, in some cases, creates line-to-line shorts.

In order to improve the reliability of ULSI devices by increasing interconnect electromigration resistance and to alleviate the aforementioned limitations of the prior art, there is a clear need of a method which can (1) limit or eliminate top surface diffusion of copper atoms or ions in copper lines, (2) improve the copper/ESL interface by enhancing its adhesion strength and electromigration resistance, (3) preserve the electrical characteristics of the interconnect system, in particular line resistance and line-to-line leakage.

SUMMARY OF THE INVENTION

The present invention addresses the above mentioned issue of unsatisfactory device reliability, due to copper electromigration at the top surface of interconnect wires, with a novel approach.

In accordance with this invention, it has been discovered that a number of specific compounds may be used to form, by dative or covalent grafting, a non-conducting (dielectric) capping layer atop the copper or copper alloy wires after chemical-mechanical polishing, without the need of an electroless deposition step.

The primary goal of this capping layer is to improve the quality of the copper—Etch Stop Layer (ESL)/Diffusion barrier interface.

The non-conductive nature of the capping layer of the invention leaves the possibility to deposit it selectively on the copper lines or non-selectively on the entire wafer surface.

According to a first aspect, the present invention is therefore directed to a method for preparing a multi layer composite device, such as a semiconductor device, which comprises the step of (A) forming a dielectric layer on the surface of a composite material having at least one area made of a dielectric material and at least one area made of copper or copper alloy, by bringing said surface of said composite material into contact:
 a) either with a solution, comprising
 the diazonium salt of aniline;
 a diazonium salt bearing at least one functional group selected from the group consisting of silane, silazane, siloxane, amine, hydroxyl and carboxyl groups; or a precursor of said diazonium salt;
 an amine compound of formula $H_2N$-A-X—Z in which:
 A is selected from the group consisting of an aryl group, preferably a phenyl group, which can be unsubstituted or substituted with an hydroxyl group, a lower alkyl group or an halogen atom; a group —CH—X—B in which
 B is an aryl or heteroaryl group, preferably a phenyl group or an heteroaryl group having 5 or 6 members and having 1 to 3 nitrogen atoms;
 X is a single bond or an alkylene group having 1 to 4 carbon atoms, preferably a —$CH_2$— or —$CH_2$—$CH_2$— group;
 Z is a functional group selected from the group consisting of silane, silazane, siloxane, amine, hydroxyl, and carboxyl groups, preferably an amine or carboxyl group;
 b) or with
 a first solution containing an aryl diazonium salt and successively
 a second solution containing a compound bearing at least one functional group selected from the group consisting of silane, silazane, siloxane, amine, hydroxyl and carboxyl groups and bearing at least one functional group capable of reacting with the aryl radical grafted on the surface of the composite material thanks to the first solution;
(B) forming an overlayer on said surface of said composite material obtained in step (A), said overlayer consisting of a Si-containing dielectric Cu-Etch Stop Layer and/or copper diffusion barrier.

It has been discovered that the diazonium salt of aniline, as well as the diazonium salts and amine compounds defined above unexpectedly i) show spontaneous reaction or strong interaction (summarized as grafting) with metallic copper and allow stabilization of Cu or Cu alloy interface with respect to electromigration;

ii) provide a high compatibility with further process steps, in particular a very good adhesion to PECVD deposited Si-containing copper or copper alloy diffusion barriers and/or etch stop layers.

Furthermore these compounds exhibit good thermal stability ensuring integration with subsequent steps.

DETAILED DESCRIPTION

The originality of the present invention therefore lies in the use of novel solutions containing one or more specific compounds as defined above which are precursors of a non-conducting capping layer that induces improved adhesion between copper and ESL to insure good electromigration resistance.

In the present description, the term "lower alkyl group" is understood to mean a straight or branched hydrocarbon chain having 1 to 4 carbon atoms. Such an alkyl group is for instance a methyl, ethyl, propyl or 1-methyl-ethyl group, preferably a methyl group.

The term "alkylene group having 1 to 4 carbon atoms" is understood to mean a straight divalent hydrocarbon chain of formula —$(CH_2)_n$— in which n is 1, 2, 3 or 4 or a branched divalent hydrocarbon chain having 1 to 4 carbon atoms such as for example —$CH(CH_3)$—, —$CH(CH_3)$—$CH_2$—, —$CH(CH_3)$—$CH_2$—$CH_2$— or —$C(CH_3)_2$—$CH_2$—.

The term "halogen atom" is understood to mean an atom of fluorine, chlorine or bromine and preferably a fluorine or chlorine atom.

The diazonium salt of aniline is understood to mean the compound of formula

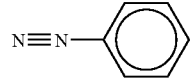

In the present invention, the dielectric (or capping) layer deposition is advantageously performed by immerging, spraying or spin-coating the wafer surface with a single solution or with two solutions containing one or more precursors of said layer.

Depending on the chosen solution composition, the capping layer can be selectively deposited on copper or copper alloy lines or non-selectively on copper or copper alloy and dielectric surfaces.

After exposure to the solution, the wafer surface may be rinsed with deionised water or isopropylic alcohol and dried, before proceeding to the standard ESL deposition process.

The resulting capping layer exhibits good thermal and plasma resistance to insure compatibility with ESL deposition.

The composition of the solutions of the invention, and in particular the concentration of precursors, will be such that the capping layer thickness is advantageously less than 15 nm, more advantageously less than 10 nm, still more advantageously less than 8 nm, even still more advantageously of between 1 and 8 nm, to minimize impact to the dielectric permittivity of the stack. The skilled person will readily determine such concentrations depending on the chemical nature of the compound(s) used.

According to a first embodiment of the invention, the surface of a composite material having at least one area made of a dielectric material and at least one area made of copper or copper alloy is brought into contact, preferably by immersion, spraying or spin-coating, with a single solution, preferably an aqueous solution, containing a compound allowing a layer to be obtained providing stabilization of Cu or Cu alloy interface with respect to electromigration and a very good adhesion to PECVD deposited Si-containing copper or copper alloy diffusion barriers and/or etch stop layers.

According to one particular embodiment, said compound is the diazonium salt of aniline which can be either in-situ generated or pre-synthesized. Excellent results have been obtained with aqueous solutions containing the in-situ generated diazonium salt of aniline in a concentration of from 5 to 50 mM, and preferably of about 10 mM, allowing a capping layer of between 1 and 8 nm to be obtained.

According to another particular embodiment, said compound is a diazonium salt bearing at least one functional group selected from the group consisting of silane, silazane, siloxane, amine, hydroxyl and carboxyl groups. It has been observed that these functional groups provide excellent adhesion to PECVD deposited Si-containing copper or copper alloy diffusion barriers and/or etch stop layers.

These diazonium salts can be either in-situ generated or pre-synthesized. In the case of in-situ generation of the diazonium salt, diazotization can proceed, as for preparing the diazonium salt of aniline, by using any nitrosyl or nitrite derivatives such as for instance sodium nitrite, a mixture of isoamyl nitrite tetrafluoroborohydride, potassium nitrite, nitrosyltetrafluoroborate, nitro-sylsulfuric acid, etc.

In the framework of the present invention, preferred diazonium salts are those compounds of formula $N{\equiv}N$-D-X—Z in which:
  D is an aryl group, preferably a phenyl group, which can be unsubstituted or substituted with an hydroxyl group, a lower alkyl group or an halogen atom;
  X is a single bond or an alkylene group having 1 to 4 carbon atoms, preferably a —$CH_2$— or —$CH_2$—$CH_2$— group;
  Z is a functional group selected from the group consisting of silane, silazane, siloxane, amine, hydroxyl and carboxyl groups, preferably an amine or carboxyl group.

Particularly preferred are diazonium salts of phenyl alkanoic acids having the formula $N{\equiv}N$-D-X—Z in which D is a phenyl group, X is an alkylene group having 1 to 4 carbon atoms, preferably a —$CH_2$— or —$CH_2$—$CH_2$— group; and Z is a carboxyl group.

Excellent results have been obtained with the following solutions:
  an aqueous solution of 4-diazophenyl acetic acid generated in-situ from 4-aminophenyl acetic acid and sodium nitrite, in a concentration of from 5 to 50 mM, and preferably of about 10 mM, allowing a capping layer of between 1 and 8 nm to be obtained;
  an aqueous solution of 4-(2-aminoethyl)phenyl diazonium salt generated in-situ from 4-(2-aminoethyl)aniline and sodium nitrite, in a concentration of from 5 to 50 mM, and preferably of about 10 mM, allowing a capping layer of between 1 and 8 nm to be obtained;
  an aqueous solution of a pre-synthesized 4-diazophenyl acetic acid tetrafluoroborate, in a concentration of from 5 to 50 mM, and preferably of about 10 mM, allowing a capping layer of between 1 and 8 nm to be obtained.

According to another particular embodiment, said compound is an amine compound of formula $H_2N$-A-X—Z as defined above.

In the framework of the present invention, preferred amine compounds are those compounds of formula $H_2N$-A-X—Z in which:
  A is a group —CH—X—B in which —B is a phenyl group or an heteroaryl group having 5 or 6 members and having 1 to 3 nitrogen atoms, preferably an imidazolyl group;
  X is a single bond or a —$CH_2$— or —$CH_2$—$CH_2$— group;
  Z is a carboxyl group.

Excellent results have been obtained with the following solutions:
  an aqueous solution of histidine, in a concentration of from 5 to 50 mM, and preferably of about 10 mM, allowing a capping layer of between 1 and 8 nm to be obtained
  an aqueous solution of 3-amino-3-phenyl propionic acid, in a concentration of from 5 to 50 mM, and preferably of about 10 mM, allowing a capping layer of between 1 and 8 nm to be obtained.

According to a second embodiment of the invention, the surface of a composite material having at least one area made of a dielectric material and at least one area made of copper or copper alloy is brought into contact, preferably by immersion, spraying or spin-coating, with a first solution, preferably an aqueous solution, containing an aryl diazonium salt and successively with a second solution containing a compound bearing at least one functional group selected from the group consisting of silane, silazane, siloxane, amine, hydroxyl and carboxyl groups and bearing at least one functional group capable of reacting with the aryl radical grafted on the surface of the composite material thanks to the aryl diazonium salt.

According to one particular embodiment, said aryl diazonium salt is a compound of formula $N{\equiv}N$-D-X—Z in which:
  D is an aryl group, preferably a phenyl group, which can be unsubstituted or substituted with an hydroxyl group, a lower alkyl group or an halogen atom;
  X is a single bond or an alkylene group having 1 to 4 carbon atoms, preferably a —$CH_2$— or —$CH_2$—$CH_2$— group;
  Z is a functional group selected from the group consisting of silane, silazane, siloxane, amine, hydroxyl and carboxyl groups, preferably an amine or carboxyl group.

These diazonium salts can be either in-situ generated or pre-synthesized as described above in relation to the first embodiment of the invention.

According to another particular embodiment, said compound bearing at least one functional group of said second solution is a polysilazane.

Excellent results have been obtained with the following solutions:
  a first aqueous solution of 4-diazosalycilic acid generated in-situ from 4-aminosalycilic acid and sodium nitrite
  a second solution allowing a traditional peptide coupling reaction between a silazane derivative (KION® Ceraset® 20 polysilazane) and the diazonium salt.

After exposure to the solutions of the present invention, the surface of the composite material is advantageously rinsed for instance with deionised water or isopropylic alcohol and dried, before proceeding to a standard ESL deposition process and/or to the deposition of a copper diffusion barrier.

In this respect, it is noted that the process of the invention is not only usable with today's industry standard for ESL/Barrier which is PECVD SiCN but also with SiN, SiC, SiOCN or SiON as well as with known types of Cu diffusion barrier.

In the method according to the present invention, the dielectric or capping layer is preferably formed after chemical-mechanical polishing (CMP) and after cleaning. Alternatively this layer can be formed during the chemical-mechanical polishing (CMP) or during the cleaning performed after CMP.

In one preferred embodiment of the invention, the composite material consist in a silicon work piece coated with a silicon dioxide layer or Si-containing low k dielectric layer deposited by plasma enhanced chemical vapor deposition (PECVD) containing copper or copper alloy lines.

More advantageously the composite material is a semiconductor device, in particular a multi layer interconnect system of an integrated circuit.

According to a second aspect, the present invention concerns the multilayer composite device obtainable by the method described above.

This device according to the present invention therefore generally comprises a dielectric layer grafted on the surface of copper or copper alloy area of the composite material, this dielectric layer and the dielectric area of the composite material being coated with a dielectric Cu-Etch Stop Layer and/or a copper diffusion barrier.

More specifically, this semiconductor device comprises:
a dielectric layer having one or more trenches;
the copper line formed in said trenches;
a capping layer formed on the copper line thus formed and covered by an overlayer consisting of a Si-containing dielectric Cu-Etch Stop Layer and/or copper diffusion barrier;
a silicon dioxide layer or Si-containing low k dielectric layer formed over said Etch Stop Layer and/or copper diffusion barrier.

Advantageously this dielectric capping layer has a thickness of less than 15 nm, more advantageously less than 10 nm, still more advantageously less than 8 nm, even still more advantageously of between 1 and 8 nm, According to a third aspect, the present invention concerns the solutions used for forming the dielectric capping layer in the method described above.

These solutions contain a solvent, preferably water or a mixture of water and a water-soluble alcohol, and at least one compound selected from the group consisting of the diazonium salt of aniline, the diazonium salts and amine compounds defined above, in a concentration sufficient for allowing a capping layer to be obtained advantageously with a thickness of less than 15 nm, more advantageously less than 10 nm, still more advantageously less than 8 nm, even still more advantageously of between 1 and 8 nm, Advantageously these solutions contain furthermore an acid such as sulfuric acid.

The present invention will now be illustrated by the following non-limiting examples in which the method according to the invention is used to prepare copper interconnect structures for semiconductor devices.

It should be noted that in these examples, bath compositions contains only water and precursor(s) of the capping layer. Of course, additional additives may further be added.

EXAMPLE 1

The substrate used in this example consisted of a silicon workpiece, coated with a 400 nm layer of silicon dioxide deposited by plasma-enhanced chemical vapor deposition (PECVD). The silicon dioxide layer was coated with a layer of tantalum nitride (TaN) having a thickness of 15 nm deposited by physical vapor deposition (PVD) on top of which a layer of tantalum (Ta) having a thickness of 10 nm was also deposited by PVD. A 100 nm copper seed layer was deposited by PVD on top of the Ta layer and a 1 μm copper layer was electrochemically deposited on the copper seed layer.

Chemical mechanical polishing (CMP) was then applied to the surface of the substrate to reduce the total copper thickness to 500 nm.

This substrate was cleaned first by immersion in a solution containing 0.1% wt. sulfuric acid for 30 seconds and then by immersion in a solution containing 2.5% wt. citric acid for 10 seconds.

The substrate was then rinsed with deionized water (DIW) and dried with nitrogen.

The substrate was then coated using the solution of the invention (see coating protocol below).

The coating was characterized by Fourier Transform Infrared (FT-IRRAS) spectroscopy.

After coating the substrate using the solution of the invention, an 80 nm thick silicon nitride (SiN) layer was deposited on the substrate by PECVD using a silane ($SiH_4$)/ammonia ($NH_3$) chemistry.

Adhesion of the SiN layer on copper was evaluated by measuring the critical force producing delamination of the SiN layer in a microscratching test.

The solution of the invention in this particular example was an aqueous solution of sulfuric acid (0.01 N) containing 0.93 gram/liter (10 mM) of aniline and 0.7 gram/liter (10 mM) of sodium nitrite.

Coating Protocol:

After cleaning the substrate using the procedure described above, the substrate was immersed in the solution of the invention for 10 minutes under ultrasonic agitation. The substrate was then rinsed with ethanol, then rinsed with DIW, then rinsed with acetone and dried with nitrogen.

Results:

FT-IRRAS Characterization:

The table below shows the different transmission bands of the coated films.

The corresponding bonds are characteristic of the aniline molecule.

| Wavenumber ($cm^{-1}$) | Identification |
|---|---|
| 1488 | γ CH aromatic cycle |
| 1166 | δ CH aromatic cycle (in plane) |
| 840, 827 | δ CH (out of plane) |

Adhesion:

Adhesion of SiN on copper was improved by 10% using the coating of the invention compared to the situation where no coating was applied on the copper surface.

Electrical Results:

Patterned substrates having copper lines inlaid in SiO2 and having structures designed for electrical performance evaluation well known by people skilled in the art, were submitted to the treatment described above. After treatment, the substrates were deposited with an 80 nm SiN layer and then passivated using the same sequence as during the fabrication of actual integrated circuits.

Treated structures as well as untreated structures were evaluated for electrical continuity, line-to-line leakage, and line resistance. This evaluation showed that structures treated as above exhibited similar performance as untreated structures.

Reliability Results:

After electrical evaluation, the structures used above, both treated and untreated, were diced in different dies and packaged using a procedure well known by people skilled in the art. The packaged dies were submitted to electromigration testing. Lifetime of the treated dies was significantly higher than the lifetime of untreated dies.

EXAMPLE 2

The substrate used in this example consisted of a silicon workpiece, coated with a 400 nm layer of silicon dioxide deposited by plasma-enhanced chemical vapor deposition (PECVD). The silicon dioxide layer was coated with a layer of tantalum nitride (TaN) having a thickness of 15 nm deposited by physical vapor deposition (PVD) on top of which a layer of tantalum (Ta) having a thickness of 10 nm was also deposited by PVD. A 100 nm copper seed layer was deposited by PVD on top of the Ta layer and a 1 µm copper layer was electrochemically deposited on the copper seed layer.

Chemical mechanical polishing (CMP) was then applied to the surface of the substrate to reduce the total copper thickness to 500 nm.

This substrate was cleaned first by immersion in a solution containing 0.1% wt. sulfuric acid for 30 seconds and then by immersion in a solution containing 2.5% wt. citric acid for 1 minute.

The substrate was then rinsed with deionized water (DIW) and dried with nitrogen.

The substrate was then coated using the solution of the invention (see coating protocol below).

The coating was characterized by Fourier Transform Infrared (FT-IRRAS) spectroscopy, time-of-flight secondary ions mass (TOF-SIMS) spectroscopy.

After coating the substrate using the solution of the invention, an 80 nm thick silicon nitride (SiN) layer was deposited on the substrate by PECVD using a silane (SiH$_4$)/ammonia (NH$_3$) chemistry.

Adhesion of the SiN layer on copper was evaluated by measuring the critical force producing delamination of the SiN layer in a microscratching test.

The solution of the invention in this particular example was an aqueous solution of sulfuric acid (0.01 N) containing 1.52 gram/liter (10 mM) of 4-aminophenyl acetic acid and 0.7 gram/liter (10 mM) of sodium nitrite.

Coating Protocol:

After cleaning the substrate using the procedure described above, the substrate was immersed in the chemical solution of the invention for 10 minutes under ultrasonic agitation. The substrate was then rinsed with ethanol, then rinsed with DIW, then rinsed with acetone and dried with nitrogen.

Results:

FT-IRRAS Characterization:

The table below shows the different transmission bands of the coated film.

The corresponding bonds are characteristic of the 4-aminophenyl acetic acid molecule.

| Wavenumber (cm$^{-1}$) | Identification |
|---|---|
| 3226 | ν O—H |
| 2937 | ν CH, CH$_2$ |
| 1730 | ν C=O |
| 1646, 1514 | γ CH aromatic cycle |
| 1394 | ν OC—OH |

| Wavenumber (cm$^{-1}$) | Identification |
|---|---|
| 1146 | δ CH aromatic cycle (in plane) |
| 811, 704 | δ CH aromatic cycle (out of plane) |

TOF-SIMS:

The Following Peaks are Attributed to the Coated Film by TOF-SIMS Spectroscopy:

| Positive ionization | Mass/Charge ratio m/z | Reference Cu (no coating) Normalized intensity | Example 2 (with coating) Normalized intensity |
|---|---|---|---|
| C$_6$H$_4$ | 76 | 18.43 | 236.06 |
| $^{63}$Cu | 63 | 8724.71 | 1823.24 |
| $^{65}$Cu | 65 | 4002.25 | 830.62 |

Adhesion:

Adhesion of SiN on copper was improved by 64% using the coating of the invention compared to the situation where no coating was applied on the copper surface.

EXAMPLE 3

The substrate used in this example consisted of a silicon workpiece, coated with a 400 nm layer of silicon dioxide deposited by plasma-enhanced chemical vapor deposition (PECVD). The silicon dioxide layer was coated with a layer of tantalum nitride (TaN) having a thickness of 15 nm deposited by physical vapor deposition (PVD) on top of which a layer of tantalum (Ta) having a thickness of 10 nm was also deposited by PVD. A 100 nm copper seed layer was deposited by PVD on top of the Ta layer and a 1 µm copper layer was electrochemically deposited on the copper seed layer.

Chemical mechanical polishing (CMP) was then applied to the surface of the substrate to reduce the total copper thickness to 500 nm.

This substrate was cleaned first by immersion in a solution containing 0.1% wt. sulfuric acid for 30 seconds and then by immersion in a solution containing 2.5% wt. citric acid for 1 minute.

The substrate was then rinsed with deionized water (DIW) and dried with nitrogen.

The substrate was then coated using the solution of the invention (see coating protocol below).

The coating was characterized by Fourier Transform Infrared (FT-IRRAS) spectroscopy, time-of-flight secondary ions mass (TOF-SIMS) spectroscopy.

After coating the substrate using the solution of the invention, an 80 nm thick silicon nitride (SiN) layer was deposited on the substrate by PECVD using a silane (SiH$_4$)/ammonia (NH$_3$) chemistry.

Adhesion of the SiN layer on copper was evaluated by measuring the critical force producing delamination of the SiN layer in a microscratching test.

The solution of the invention in this particular example was an aqueous solution of sulfuric acid (0.01 N) containing 1.4 milliliter/liter (10 mM) of 4-(2-aminoethyl)aniline and 0.7 gram/liter (10 mM) of sodium nitrite.

Coating Protocol:

After cleaning the substrate using the procedure described above, the substrate was immersed in the solution of the invention for 10 minutes under ultrasonic agitation. The substrate was then rinsed with ethanol, then rinsed with DIW, then rinsed with acetone and dried with nitrogen.

Results:

FT-IRRAS Characterization:

The table below shows the different transmission bands of the coated films.

The corresponding bonds are characteristic of the 4-(2-aminoethyl)aniline molecule.

| Wavenumber ($cm^{-1}$) | Identification |
|---|---|
| 3226 | $\nu$ N—H |
| 2910, 2834 | $\nu$ CH, $CH_2$ |
| 1592 | $\delta$ N—H |
| 1502, 1364 | $\gamma$ CH aromatic cycle |
| 1213 | $\nu$ N—C |
| 1117 | $\delta$ CH-aromatic cycle |
| 825 | $\delta$ $NH_2$ |

TOF-SIMS:

The Following Peaks are Attributed to the Coated Film by TOF-SIMS Spectroscopy:

| | Mass/Charge ratio m/z | Reference Cu (no coating) Normalized intensity | Example 3 (with coating) Normalized intensity |
|---|---|---|---|
| Negative ionization | | | |
| NH | 15 | 7.15 | 132.01 |
| CN | 26 | 2278.49 | 6583.31 |
| Positive ionization | | | |
| $NH_3$ | 17 | 2.29 | 178.17 |
| $C_6H_4$ | 76 | 20.71 | 111.19 |
| $C_8H_{10}N$ | 120 | 30.31 | 426.73 |

Adhesion:

Adhesion of SiN on copper was improved by 64% using the coating of the invention compared to the situation where no coating was applied on the copper surface.

EXAMPLE 4

The substrate used in this example consisted of a silicon workpiece, coated with a 400 nm layer of silicon dioxide deposited by plasma-enhanced chemical vapor deposition (PECVD). The silicon dioxide layer was coated with a layer of tantalum nitride (TaN) having a thickness of 15 nm deposited by physical vapor deposition (PVD) on top of which a layer of tantalum (Ta) having a thickness of 10 nm was also deposited by PVD. A 100 nm copper seed layer was deposited by PVD on top of the Ta layer and a 1 µm copper layer was electrochemically deposited on the copper seed layer.

Chemical mechanical polishing (CMP) was then applied to the surface of the substrate to reduce the total copper thickness to 500 nm.

This substrate was cleaned first by immersion in a solution containing 0.1% wt. sulfuric acid for 30 seconds and then by immersion in a solution containing 2.5% wt. citric acid for 1 minute.

The substrate was then rinsed with deionized water (DIW) and dried with nitrogen.

The substrate was then coated using the solution of the invention (see coating protocol below).

The coating was characterized by Fourier Transform Infrared (FT-IRRAS) spectroscopy, time-of-flight secondary ions mass (TOF-SIMS) spectroscopy.

After coating the substrate using the solution of the invention, an 80 nm thick silicon nitride (SiN) layer was deposited on the substrate by PECVD using a silane ($SiH_4$)/ammonia ($NH_3$) chemistry.

Adhesion of the SiN layer on copper was evaluated by measuring the critical force producing delamination of the SiN layer in a microscratching test.

The solution of the invention in this particular example was an aqueous solution of sulfuric acid (0.01 N) containing 2.2 gram/liter (10 mM) of 4-(diazo)phenylacetic acid tetrafluoroborate.

Coating Protocol:

After cleaning the substrate using the procedure described above, the substrate was immersed in the solution of the invention for 10 minutes under ultrasonic agitation. The substrate was then rinsed with ethanol, then rinsed with DIW, then rinsed with acetone and dried with nitrogen.

Results:

FT-IRRAS Characterization:

The table below shows the different transmission bands of the coated films.

The corresponding bonds are characteristic of the 4-(diazo)phenylacetic acid tetrafluoroborate molecule.

| Wavenumber ($cm^{-1}$) | Identification |
|---|---|
| 3256 | $\nu$ O—H |
| 2947 | $\nu$ CH, $CH_2$ |
| 1730 | $\nu$ C=O |
| 1653, 1517 | $\gamma$ CH aromatic cycle |
| 1399 | $\nu$ OC—OH |
| 1155 | $\delta$ CH aromatic cycle (in plane) |
| 811, 707 | $\delta$ CH (out of plane) |

TOF-SIMS:

The Following Peaks are Attributed to the Coated Film by TOF-SIMS Spectroscopy:

| | Charge/mass ratio m/z | Reference Cu (no coating) Normalized intensity | Example 4 (with coating) Normalized intensity |
|---|---|---|---|
| Negative ionization | | | |
| CHO | 45 | 100.28 | 1854.62 |
| $CH_2COOH$ | 59 | 56.54 | 249.6 |
| Positive ionization | | | |
| $^{63}Cu$ | 63 | 8724.71 | 1823.24 |
| $^{65}Cu$ | 65 | 4002.25 | 830.62 |

Adhesion:

Adhesion of SiN on copper was improved by 10% using the coating of the invention compared to the situation where no coating was applied on the copper surface.

EXAMPLE 5

The substrate used in this example consisted of a silicon workpiece, coated with a 400 nm layer of silicon dioxide deposited by plasma-enhanced chemical vapor deposition (PECVD). The silicon dioxide layer was coated with a layer of tantalum nitride (TaN) having a thickness of 15 nm deposited by physical vapor deposition (PVD) on top of which a layer of tantalum (Ta) having a thickness of 10 nm was also deposited by PVD. A 100 nm copper seed layer was deposited by PVD on top of the Ta layer and a 1 μm copper layer was electrochemically deposited on the copper seed layer.

Chemical mechanical polishing (CMP) was then applied to the surface of the substrate to reduce the total copper thickness to 500 nm.

This substrate was cleaned first by immersion in a solution containing 0.1% wt. sulfuric acid for 30 seconds and then by immersion in a solution containing 2.5% wt. citric acid for 1 minute.

The substrate was then rinsed with deionized water (DIW) and dried with nitrogen.

The substrate was then coated in two steps, each using a specific solution (see coating protocol below).

The coating was characterized by Fourier Transform Infrared (FT-IRRAS) spectroscopy.

After coating the substrate using the solutions of the invention, an 80 nm thick silicon nitride (SiN) layer was deposited on the substrate by PECVD using a silane ($SiH_4$)/ammonia ($NH_3$) chemistry.

Adhesion of the SiN layer on copper was measured by the 4-point bend technique.

In this particular example, two solutions were used sequentially to coat the cleaned substrate.

The first solution used in this particular example was an aqueous solution of sulfuric acid (0.01 N) containing 1.54 gram/liter (10 mM) of 4-aminosalicylic acid and 0.7 gram/liter (10 mM) of sodium nitrite.

The second solution used in this particular example used N,N'-dimethyl formamide (DMF) as solvent and contained 43.2 gram/liter (0.3 M) of N-hydroxybenzotriazole (HOBt), 52 milliliter/liter (0.3 M) of N,N' diisopropylamine, 50 milliliter/liter (0.3 M) of N,N'-diisopropylcarbodiimide (DIPCDI) and 20 gram/liter of KION® Ceraset® 20 polysilazane.

Coating Protocol:
Step 1:

After cleaning the substrate using the procedure described above, the substrate was immersed in the first solution for 10 minutes under ultrasonic agitation. The substrate was then rinsed with ethanol, then DIW, then rinsed with acetone and dried with nitrogen.

Step 2:

After performing Step 1 using the procedure described above, the substrate was immersed in the second solution for 30 minutes under ultrasonic agitation. The substrate was then rinsed with DMF, then rinsed with DIW, then rinsed with acetone and dried with nitrogen.

Results:

FT-IRRAS Characterization:

The table below shows the different transmission bands present on the substrate Step 1 of the coating protocol.

The corresponding bonds are characteristic of the 4-aminosalycilic acid molecule.

| Wavenumber ($cm^{-1}$) | Identification |
| --- | --- |
| 3431, 3258 | ν O—H |
| 2993 | ν CH, $CH_2$ |
| 1610 | ν C=O |
| 1529, 1393 | γ CH aromatic cycle |
| 1273 | ν OC—OH |
| 1053, 997, 839 | δ CH aromatic cycle (out of plane), δ OC—OH (in and out of plane), |

The table below shows the different transmission bands present on the substrate Step 2 of the coating protocol.

The corresponding bonds are characteristic of the 4-aminosalycilic acid and silazane molecules.

| Wavenumber ($cm^{-1}$) | Identification |
| --- | --- |
| 3354 | ν N—H |
| 2178 | ν Si—H |
| 1530 | ν N—Si |
| 1064 | γ NH—Si, N—H, SiCH=CH2, N—Si |
| 1273 | ν OC—OH |
| 1053, 997, 839 | δ CH aromatic cycle (out of plane) δ OC—OH (in and out of plane) |

Adhesion:

Adhesion of SiN on copper was improved by 60% using the coating of the invention compared to the situation where no coating was applied on the copper surface.

EXAMPLES 6 AND 7

Following the protocol of example 1 an aqueous solution of histidine and aqueous solution of 3-amino-3-phenyl propionic acid were tested.

The results thus obtained are summarized in the following table:

| Precursor | Formula | Solution/Protocol | Adhesion improvement (%) |
| --- | --- | --- | --- |
| Histidine | $C_3H_2N_2H$—$CH_2$—CH—$NH_2$—COOH | 10 mM aqueous solution/ clean as in example 1 + 10 min immersion + rinse with deionized water + dry | 18% |
| 3-Amino-3 phenyl propionic acid | $C_6H_5$—CH—$NH_2$—COOH | 10 mM aqueous solution/ clean as in example 1 + 10 min immersion + rinse with isopropylic alcohol + dry | 21% |

As can be seen from the above description and examples, the novel solutions according to the invention allow a dielectric capping layer to be obtained which induces improved adhesion between copper and ESL to insure good electromigration resistance.

The invention claimed is:

1. A method for preparing a multi layer composite device which comprises the steps of
   (A) forming a dielectric layer on the surface of a composite material having at least one area made of a dielectric material and at least one area made of copper or copper alloy, by bringing said surface of said composite material into contact:
   a) either with a solution, comprising at least one compound selected from the group consisting of:
      the diazonium salt of aniline;
      a diazonium salt bearing at least one functional group selected from the group consisting of silane, silazane, siloxane, amine, hydroxyl and carboxyl groups ;or a precursor of said diazonium salt; and
      an amine compound of formula $H_2N$-A-X—Z in which:
      A is selected from the group consisting of an aryl group, which can be unsubstituted or substituted with a hydroxyl group, a lower alkyl group or a halogen atom; a group —CH—X—B in which —B is an aryl or heteroaryl group;
      X is a single bond or an alkylene group having 1 to 4 carbon atoms;
      Z is a functional group selected from the group consisting of silane, silazane, siloxane, amine, hydroxyl and carboxyl groups,
   b) or with
      a first solution containing an aryl diazonium salt and successively
      a second solution containing a compound bearing at least one functional group selected from the group consisting of silane, silazane, siloxane, amine, hydroxyl and carboxyl groups and bearing at least one functional group capable of reacting with the aryl radical grafted on the surface of the composite material that is a product of the aryl diazonium salt;
   (B) forming an overlayer, said overlayer consisting of a Si-containing dielectric Cu-Etch Stop Layer and/or copper diffusion barrier, said overlayer is formed directly on the dielectric layer obtained in step (A) that is formed on at least one area made of a dielectric material and at least one area made of copper or copper alloy.

2. The method as claimed in claim 1, wherein said diazonium salt bearing at least one functional group is a compound of formula N≡N-D-X—Z in which:
   D is an aryl group, which can be unsubstituted or substituted with a hydroxyl group, a lower alkyl group or a halogen atom;
   X is a single bond or an alkylene group having 1 to 4 carbon atoms;
   Z is a functional group selected from the group consisting of silane, silazane, siloxane, amine, hydroxyl and carboxyl groups.

3. The method as claimed in claim 1, wherein said diazonium salt used in said first solution in step (A) b) is a compound of formula N≡N-D-X—Z in which:
   D is an aryl group, which can be unsubstituted or substituted with a hydroxyl group, a lower alkyl group or a halogen atom;
   X is a single bond or an alkylene group having 1 to 4 carbon atoms;
   Z is a functional group selected from the group consisting of silane, silazane, siloxane, amine, hydroxyl and carboxyl groups.

4. The method as claimed in claim 3, wherein said compound bearing at least one functional group of said second solution is a polysilazane.

5. The method as claimed in claim 2, wherein said diazonium salt is a diazonium salt of a phenyl alkanoic acid of formula N≡N-D-X—Z in which D is a phenyl group, X is an alkylene group having 1 to 4 carbon atoms and Z is a carboxyl group.

6. The method as claimed in claim 1, wherein said step of bringing said surface of said composite material into contact with said solution, comprises immersing, spraying or spin-coating said solution onto said surface of said composite material.

7. The method as claimed in claim 1, wherein the composite material is a semiconductor device, in particular a multi layer interconnect system.

8. The multilayer composite device obtainable by the method according to claim 1.

9. A composition for use in the method according to claim 1 which consists in a solution containing a solvent, and at least one compound selected from the group consisting of:
   the diazonium salt of aniline;
   a diazonium salt bearing at least one functional group selected from the group consisting of silane, silazane, siloxane, amine, hydroxyl and carboxyl groups ;or a precursor of said diazonium salt;
   an amine compound of formula $H_2N$-A-X—Z in which:
   A is selected from the group consisting of an aryl group, which can be unsubstituted or substituted with a hydroxyl group, a lower alkyl group or a halogen atom; a group —CH—X—B in which —B is an aryl or heteroaryl group;
   X is a single bond or an alkylene group having 1 to 4 carbon atoms;
   Z is a functional group selected from the group consisting of silane, silazane, siloxane, amine, hydroxyl and carboxyl groups.

10. The composition as claimed in claim 9, wherein said compound is present in a concentration sufficient for allowing a capping layer to be obtained with a thickness of less than 15 nm.

11. The method as claimed in claim 1, wherein said solution in step (A)a) is an amine compound of formula $H_2N$-A-X—Z in which:
   A is selected from the group consisting of a phenyl group, which can be unsubstituted or substituted with a hydroxyl group, a lower alkyl group or a halogen atom; a group —CH—X—B in which
   B is a phenyl group or a heteroaryl group having 5 or 6 members and having 1 to 3 nitrogen atoms;
   X is a single bond or a —$CH_2$— or —$CH_2$—$CH_2$— group;
   Z is a functional group selected from the group consisting of amine, hydroxyl and carboxyl groups.

12. The method as claimed in claim 5, wherein X is a —$CH_2$— or —$CH_2$—$CH_2$— group.

13. A composition as claimed in claim 9, wherein said solvent is water or a mixture of water and a water soluble alcohol.

14. A composition for use in the method according to claim 1 which consists in a solution containing a solvent, and at least one compound selected from the group consisting of:
   the diazonium salt of aniline;
   a diazonium salt bearing at least one functional group selected from the group consisting of silane, silazane, siloxane, amine, hydroxyl and carboxyl groups ;or a precursor of said diazonium salt;

an amine compound of formula $H_2N$-A-X—Z in which:

A is selected from the group consisting of a phenyl group, which can be unsubstituted or substituted with a hydroxyl group, a lower alkyl group or a halogen atom; a group —CH—X—B in which —B is a phenyl group or a heteroaryl group having 5 or 6 members and having 1 to 3 nitrogen atoms;

X is a single bond or a $CH_2$ or $CH_2$—$CH_2$ group;

Z is a functional group selected from amine and carboxyl groups.

15. The composition as claimed in claim 14, wherein said compound is present in a concentration sufficient for allowing a capping layer to be obtained with a thickness of between 1 and 8 nm.

16. A method as claimed in claim 1, wherein said multilayer composite device is a semiconductor device.

* * * * *